(12) United States Patent  
Koenen

(10) Patent No.: US 7,889,314 B2
(45) Date of Patent: Feb. 15, 2011

(54) CALIBRATION METHODS, LITHOGRAPHIC APPARATUS AND PATTERNING DEVICE FOR SUCH LITHOGRAPHIC APPARATUS

(75) Inventor: Willem Herman Gertruda Anna Koenen, Roermond (NL)

(73) Assignee: ASML Netherlands B.V., Veldhoven (NL)

( * ) Notice: Subject to any disclaimer, the term of this patent is extended or adjusted under 35 U.S.C. 154(b) by 525 days.

(21) Appl. No.: 11/387,050

(22) Filed: Mar. 23, 2006

(65) Prior Publication Data

US 2007/0222965 A1 Sep. 27, 2007

(51) Int. Cl.
G03B 27/42 (2006.01)
(52) U.S. Cl. .............................. 355/53; 355/55; 355/77
(58) Field of Classification Search .................. 355/77, 355/53, 55
See application file for complete search history.

(56) References Cited

U.S. PATENT DOCUMENTS

| 5,402,224 | A | * | 3/1995 | Hirukawa et al. | ............ 356/124 |
| 2002/0015158 | A1 | | 2/2002 | Shiode et al. | |
| 2002/0100012 | A1 | | 7/2002 | Sutani et al. | |
| 2006/0023178 | A1 | * | 2/2006 | Loopstra et al. | ............... 355/53 |

FOREIGN PATENT DOCUMENTS

| JP | 6029172 A | 2/1994 |
| JP | 6204105 A | 7/1994 |
| JP | 7297102 A | 11/1995 |
| JP | 2000323404 A | 11/2000 |
| JP | 2003257834 A | 9/2003 |
| JP | 2007067018 A | 3/2007 |

OTHER PUBLICATIONS

Office Action in related Japanese application No. 2007-067920 mailed Feb. 23, 2010.

* cited by examiner

*Primary Examiner*—Edward J Glick
*Assistant Examiner*—Mesfin T Asfaw
(74) *Attorney, Agent, or Firm*—Pillsbury Winthrop Shaw Pittman LLP

(57) ABSTRACT

A calibration method to calibrate a substrate table position in a lithographic apparatus, the method including repeatedly irradiating a pattern onto a surface of the substrate so as to create a two dimensional arrangement of patterns on the surface of the substrate, the irradiating including displacing the substrate table between successive irradiations to irradiate the pattern onto different locations on the surface of the substrate, reading out the patterns in the two dimensions to obtain pattern read out results, deriving incremental position deviations from the read out results of neighboring patterns in dependency on the position of the substrate table in the two dimensions, deriving from the incremental position deviations a position error of the substrate table as a function of the two dimensional position of the substrate table and calibrating the position of the substrate table using the position dependent position error.

20 Claims, 5 Drawing Sheets

CALIBRATION METHODS, LITHOGRAPHIC APPARATUS AND PATTERNING DEVICE FOR SUCH LITHOGRAPHIC APPARATUS

BACKGROUND

1. Field of the Invention

The present invention relates to a calibration method to calibrate a substrate table position in a lithographic apparatus. Further, the invention relates to a lithographic apparatus including a control system to control a position of a substrate table, the control system being arranged to calibrate the position of the substrate table. Also, the present invention relates to a patterning device for a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, a position of the substrate table is measured by a substrate table position measurement system including one or more position sensors. The position sensors may include e.g. an interferometer and/or an encoder. The interferometer is a type of optical measurement device which measures a distance towards a reference, commonly a mirror or other reflecting surface. The encoder is a type of optical measurement device which measures a position of a reference by detecting an interaction of an optical beam of the interferometer with a pattern on the reference, the pattern including e.g. a grid, a grating, etc. Depending on a position of the reference, a different reflection, diffraction, etc. (depending on a type of interferometer) will occur, which is detected, thereby providing position information regarding the reference. In existing designs of lithographic apparatuses, use may be made of a substrate table which includes reflecting sides. The sides are used as mirrors by interferometers which direct a measurement beam to the reflecting sides. A plurality of interferometers may be used, each directed at e.g. a different side of the substrate table, or two or more interferometers being directed to a same side of the substrate table, thereby providing information as to a length of an optical part between the interferometer and the reflecting side of the substrate table. Thereby, a position of the substrate table may be measured in a plane substantially parallel to the surface of the substrate held by the substrate table. This plane is commonly indicated by an X, Y plane, while a dimension perpendicular to the surface of a substrate held by the substrate table is commonly referred to as a Z dimension. By such a combination of interferometers, a position of the substrate table may be provided in X direction, Y direction, as well as in a rotation with respect to the Z axis.

However, the references, thus in this example the reflecting sides of the substrate table, may show imperfections, in particular may show irregularities on the surface thereof. As the interferometers measure a length of an optical path, any unflatness of the reflecting sides will result in an error in the measurement of the position of the substrate table. Assume for example that interferometers are directed towards two sides of the substrate table, one side being substantially parallel to the X direction, while the other side being substantially parallel to the Y direction. The interferometers directed to the side of the substrate table parallel to the X direction provide information as to the position of the substrate table in the Y direction, and vice versa. Further, by having two or more interferometers directed to a same side of the substrate table information as to a rotation of the substrate table with respect to the Z axis, may be provided. An irregularity in a flatness of the mirror (thus the reflecting side) parallel to the X axis will translate into a measurement error in the position of the substrate table in Y direction, while an unflatness at the side of the substrate table parallel to the Y axis will translate into a measurement error of the position of the substrate table in X direction. By its nature, a deviation of the surface of the side of the substrate table against which the interferometer beam reflects, may differ depending on the position at which the beam reflects at that surface.

Therefore, a position dependent error has come into existence, as a deviation of the reflecting surface may differ for each part of that surface. As a practical approximation, an error of the interferometer to measure a position of the substrate table in X direction is dependent on a position in Y direction of the substrate table, and vice versa. Further, an error in a measurement of a rotation of the substrate table with respect to the Z axis is dependent on a position of the substrate table in Y direction, assuming that the rotation is measured by directing two or more interferometers towards a side of the substrate table which is parallel to the Y direction.

A calibration may now be performed by repeatedly irradiating a pattern onto the surface of the substrate, the substrate being displaced between successive irradiations thereby irradiating the patterns next to each other, or partly overlapping, to form a single dimensional arrangement of patterns on the surface of the substrate, the arrangement extending preferably in X direction or Y direction. The patterns are read out and incremental position deviations are derived from reading out neighbouring (e.g. partly overlapping) patterns. Therefrom a position error is derived which may be used to calibrate the position of the substrate table in the dimension in question. It is noted that this calibration does not provide a separate calibration for the interferometer, however provides a calibrations of the positioning system as a whole which provides for the positioning of the substrate table, the interferometer in question forming part of that positioning system.

In recent designs of lithographic apparatuses, requirements as to an accuracy of a position measurement of the substrate table are increased. To be able to provide a sufficiently accurate position measurement of the substrate table, use has been made in such configurations of a different type of position measurement, as compared to the interferometer configuration described above. In this configuration, use is made of a two dimensional grating provided over the substrate table. The substrate table is provided with a plurality of sensors which provide position information by directing appropriate measurement beams towards the grid or grating. The measurement sensors may e.g. include interferometers, encoders, or any combination thereof, depending on the position information to be obtained from that particular sensor. In these configurations, each of the sensors is prone to an error which is dependent on the position of the substrate table in X direction as well as the position of the substrate table in Y direction. From the signals provided by the individual sensors, a position of the substrate table in up to 6 degrees of freedom may be derived. The position of the substrate table in each of these degrees of freedom may thus show an error which is dependent on the position of the substrate table in X direction as well as in Y direction. To be able to calibrate the position of the substrate table in such a configuration, the calibration as described above does not provide sufficient results, as it does not take into account the multidimensional source of error which comes forward here.

SUMMARY

It is desirable to provide an improved calibration for a lithographic apparatus.

According to an embodiment of the invention, there is provided a calibration method to calibrate a substrate table position in a lithographic apparatus, the method including: repeatedly irradiating a pattern onto a surface of the substrate, thereby displacing the substrate table between successive irradiations to irradiate the pattern onto different locations on the surface of the substrate, thereby creating a two dimensional arrangement of patterns on the surface of the substrate; reading out the patterns to obtain pattern read out results; deriving incremental position deviations from the read out results of neighbouring patterns in dependency on the position of the substrate table in the two dimensions; deriving from the incremental position deviations a position error of the substrate table as a function of the two dimensional position of the substrate table; and calibrating the position of the substrate table using the position dependent position error.

In another embodiment of the invention, there is provided a lithographic apparatus including: a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a control system to control a position of the substrate table, the control system being arranged to calibrate the position of the substrate table by: repeatedly irradiating a pattern onto a surface of the substrate, thereby displacing the substrate table between successive irradiations to irradiate the pattern onto different locations on the surface of the substrate, thereby creating a two dimensional arrangement of patterns on the surface of the substrate; reading out the patterns to obtain pattern read out results; deriving incremental position deviations from the read out results of neighboring patterns in dependency on the position of the substrate table in the two dimensions; deriving from the incremental position deviations a position error of the substrate table as a function of the two dimensional position of the substrate table; and calibrating the position of the substrate table using the position dependent position error.

According to a further embodiment of the invention, there is provided a patterning device for a lithographic apparatus, the patterning device including a pattern including a plurality of marks extending along first and second dimensions along the surface of the patterning device, the marks extending along a first dimension including marks to detect displacements in the first dimension and displacements in a third dimension perpendicular to the first and second dimensions, the marks extending along the second dimension including marks to detect displacements in the second and third dimensions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
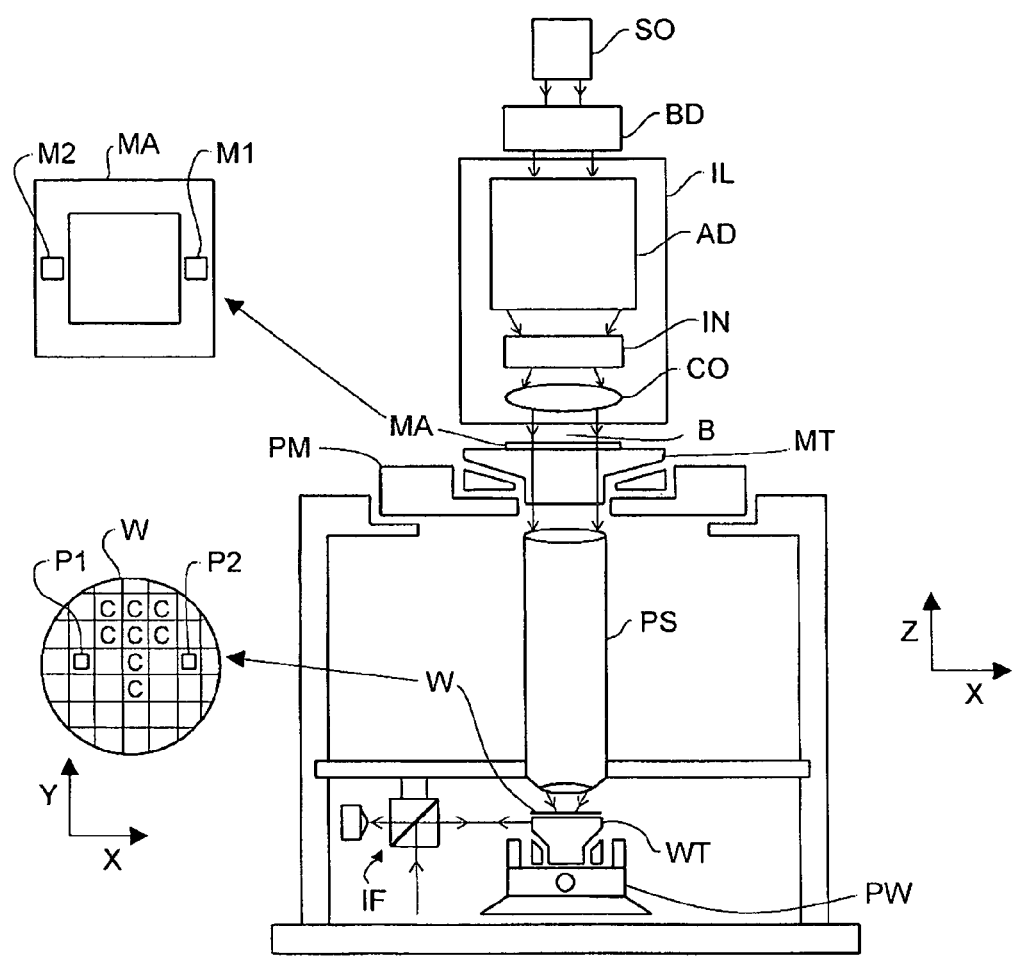
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder, planar encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
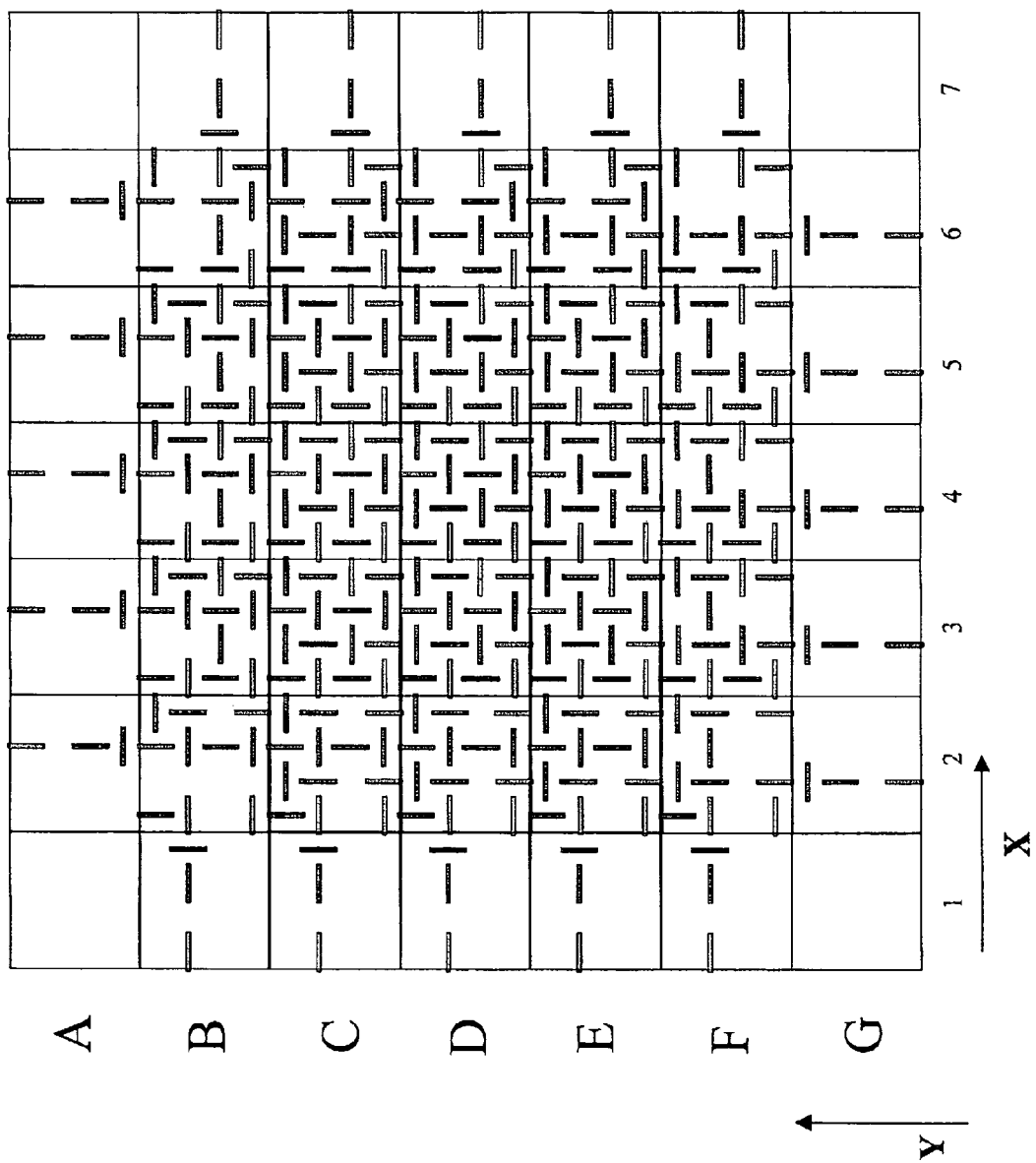
FIG. 2 depicts a top view of an arrangement of patterns according to en embodiment of the invention.
Figure 4:
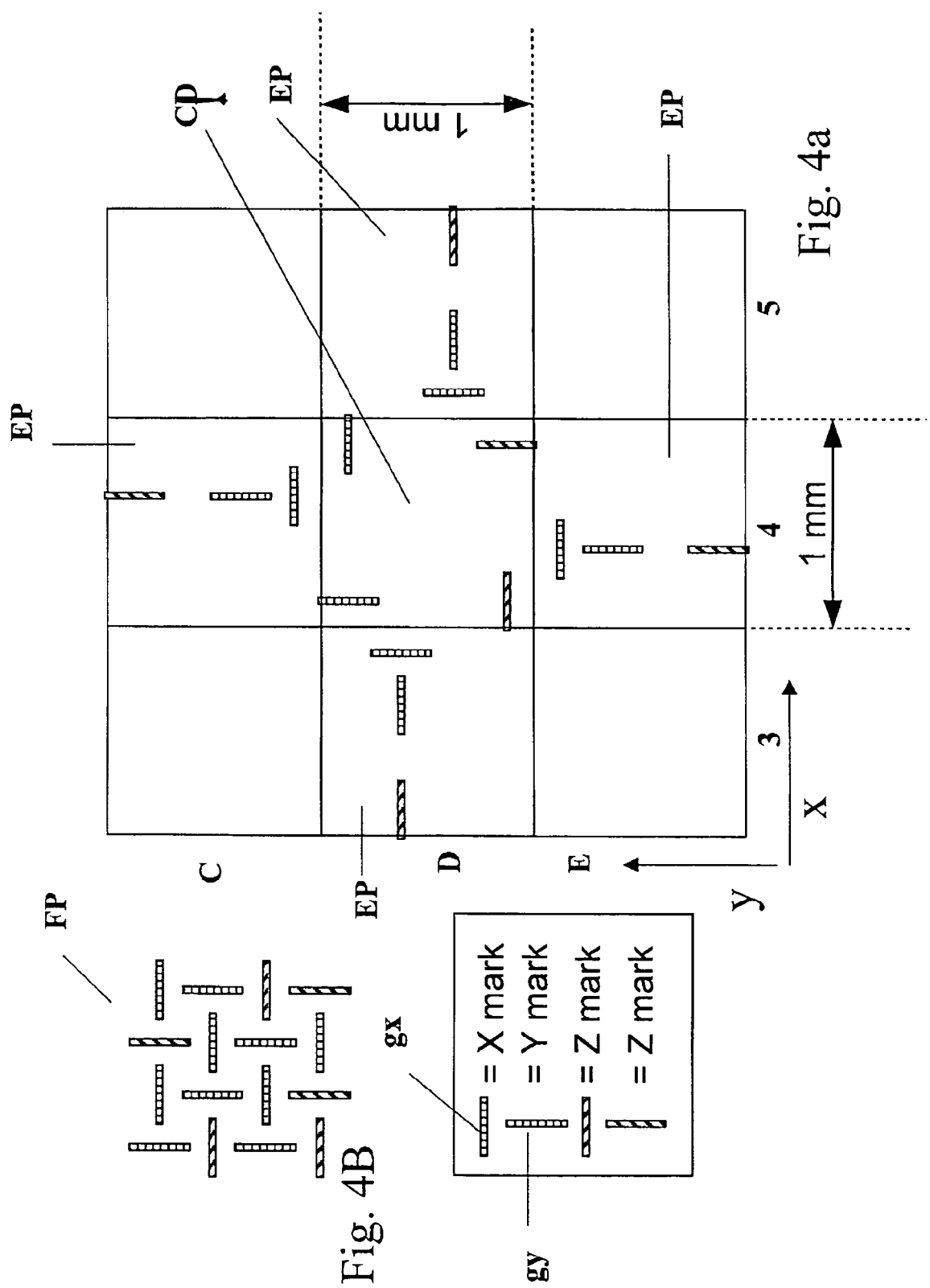
FIGS. 4a and 4b depict a pattern according to an embodiment of the invention.

FIG. 2 depicts an arrangement of patterns on a surface of substrate W. The patterns are repeated in X direction as well as in Y direction. Thereto, the substrate table is displaced between successive irradiations of the pattern, to create a two-dimensional arrangement of patterns. An example of an individual pattern is depicted in FIG. 4a-b and will be described below in more detail. The patterns have been arranged on the surface of the substrate W in two dimensions to form the two-dimensional arrangement. A relevant part of the surface of the substrate W on which the patterns are arranged, has been divided by a two-dimensional grid (in this example including squares), which is for a purpose of explanation only. The squares have been indicated by 1, 2, 3, 4, ... 7 along the X axis and by A, B, C, ... G along the Y axis. It is to be understood that the grid and the lines delimiting the squares are for illustrative purposes only, and are to be understood as not to form a part of the pattern itself, nor being physically present on the surface of the substrate. In this example, one of the patterns is irradiated on an area including squares A1-A3 to C1-C3, thus including 9 squares. A next one of the patterns may for exampled be irradiated onto an area including A2-A4 to C2-C4, thus also including 3×3 squares and partly overlapping the pattern which has been irradiated previously on the substrate. A following pattern is in this example irradiated on an area including A3-A5 to C3-C5, etc. Similarly, a pattern may be irradiated onto the area including B1-B3 to D1-D3, again a pattern on an area including B2-B4 to D2-D4, etc. Thus, in the example shown here, the patterns overlap each other in two dimensions, i.e. in X direction as well as in Y direction. Neighbouring patterns may or may not overlap each other. In the example shown here, patterns thus overlap two neighbouring patterns in each of the two dimensions (except for the patterns projected at edges of the arrangement of patterns). It will be understood that the arrangement including A1-G7 may be extended in X as well as Y direction to cover a larger part of the surface of the substrate. In a practical implementation, a usable surface of the substrate as a whole may have been irradiated with the pattern as depicted here, to be able to calibrate a position of the substrate table at a position of the substrate table which corresponds to the position of that particular pattern. It will be understood that many designs, i.e. many lay outs of the pattern may be used, the pattern shown here only providing an example. A more detailed explanation as to the lay out of elements of the pattern will be provided below. To be able to perform calibration as a function of the position in a plane according to the two dimensions, the two dimensional arrangement includes a 2 dimensional matrix according to the two dimensions, the matrix including at least 2 times 2 patterns. In the example shown here, a larger matrix is shown, as thereby the additional patterns provide additional incremental positions deviations, enabling to more exactly calibrate the position of the substrate table, as the additional incremental position deviations provide more position dependent position errors.

It is noted that in this document, the position dependent error (unless the context indicates otherwise) should be understood as an error depending on the 2 dimensional position in the plane of the arrangement of patterns. The position error or the position calibration itself however may include up to 2 degrees of freedom, thus may include x, y, z as well as rotatations with respect to these dimensions.

Figure 5:
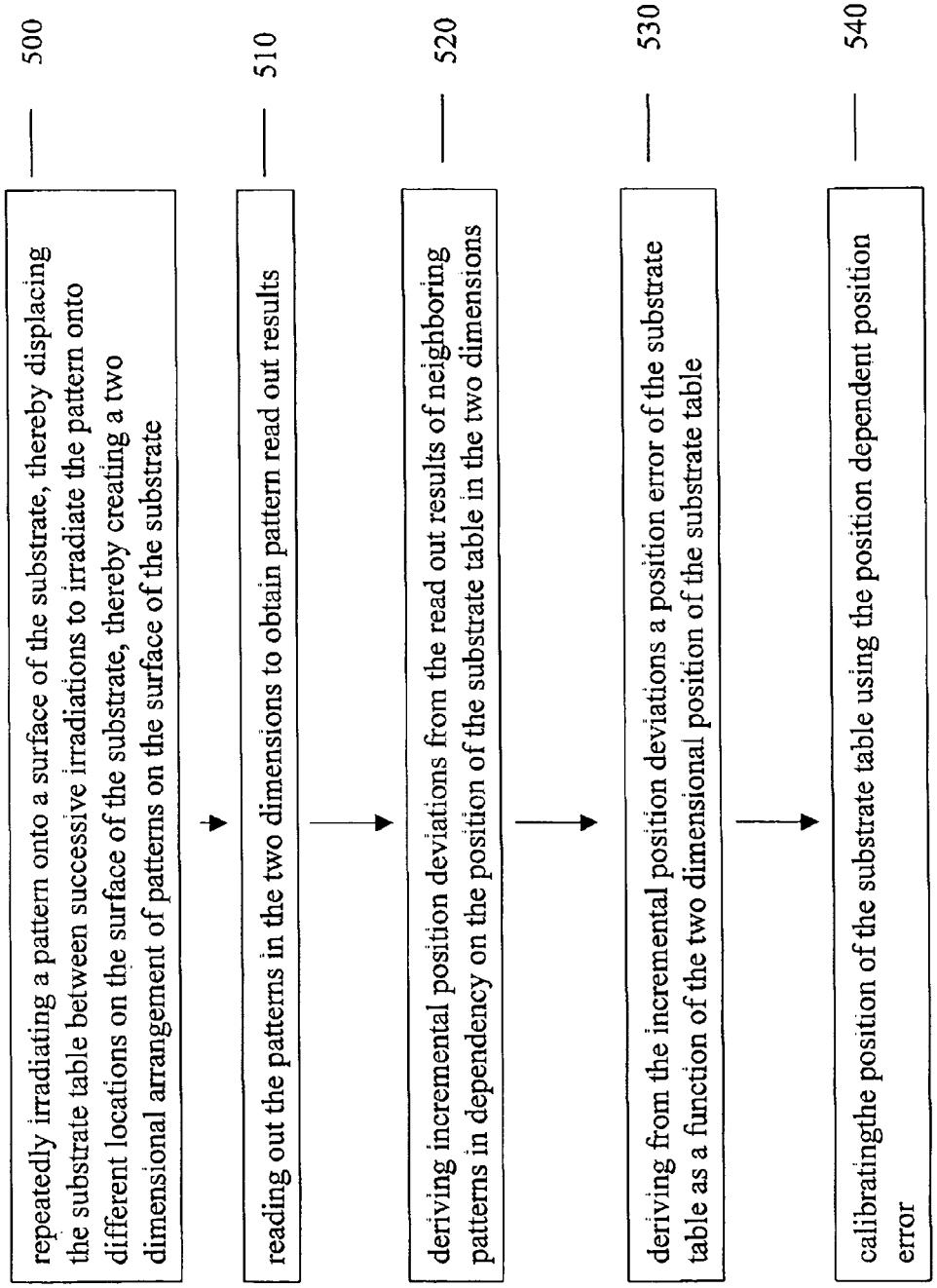
FIG. 5 depicts a flow diagram of a calibration method according to an embodiment of the invention.

Referring now to FIG. 5, the calibration method according to an embodiment of the invention will now be described with reference to steps 500-540. In step 500, a pattern is repeatedly irradiated onto a surface of the substrate (e.g. substrate W in FIG. 1), thereby displacing the substrate table WT (FIG. 1) between successive irradiations to irradiate the pattern onto different location on the surface of the substrate. Thereby, a two dimensional arrangement of patterns is created on the surface of the substrate W, an example of which having been depicted in and described with reference to FIG. 2. Then, as indicated in step 510, the patterns are read out to obtain pattern read out results. Reading out the patterns may be performed in many ways. It is for example possible that the patterns are scanned making use of a measurement beam, which e.g. scans successive marks of the pattern which extend along the X or Y direction. By scanning successive marks, which belong to successive patterns, incremental position deviations may easily be derived, as such incremental position deviation may easily be derived from the read out results of successive marks. It will be appreciated that any other reading out may be applied also. Now that the reading out of the patterns has been performed, position deviations can be derived therefrom. The position deviations may e.g. include incremental position deviations, thus position deviations between e.g. successive patterns in each of the two dimensions, as described in step 520. Also, the position deviations may include incremental position deviations in both directions, e.g. making use of marks having a diagonal overlap. Then, in step 530, the incremental position deviations are applied to derive therefrom a position error of the substrate table as a function of the two-dimensional position of the substrate table. Thus, from the position deviations as obtained in 520, a position error is derived which position error may be two dimensional, e.g. including an X component and an Y component (as defined in FIG. 2), however may also include other dimensions or rotations, as will be described in more detail below. The error may be a function of the two dimensional position of the substrate table, thus be dependent on the position of the substrate table. The position error of the substrate, or better to say of the substrate table, implies that the position error is now known in dependency on the position of the substrate table. Thus, position dependent errors which may occur and which may depend on the position of the substrate table in the plane defined by the X and Y axis (thus in the plain of movement of the substrate table) may be taken into account to calibrate the position of the substrate table (step 540). It is noted that the calibration as described here does not calibrate the sensors per se (e.g. the encoders, interferometers which measure the position of the substrate table), however instead the calibration as described here calibrates the positioning of the substrate table as a whole, including sensors, control, actuators, etc.

As already described with reference to FIG. 2, the pattern may include marks which extend along the X dimension or the Y dimension. By repeatedly irradiating the pattern onto the substrate and displacing the substrate table such that successive patterns are offset with respect to each other in the X dimension or the Y dimension will result in an arrangement including lines made up of the mark, the lines forming a full line or a dotted line, depending on the size of the marks and the offset (distance) between successive patterns. These lines now make it easy to derive position deviations therefrom, as a read out of the pattern may be performed by scanning the pattern along the lines, and from a read out of a line including a plurality of marks, information may be derived as to the incremental position deviation between successive patterns, i.e. between marks of successive patterns. By providing an overlap between the neighbouring patterns, as for example depicted in FIG. 2, where each of the patterns overlaps in each of the dimensions which two neighbouring patterns (except for the patterns at the outside of the arrangement of patterns, it is provided that marks of two neighbouring patterns are close to each other (or may even overlap in case of box-in-box structures), which decreases the sensitivity of the readout results to readout device non-ideal behaviour (such as substrate table positioning errors of the readout device).

Figure 3:
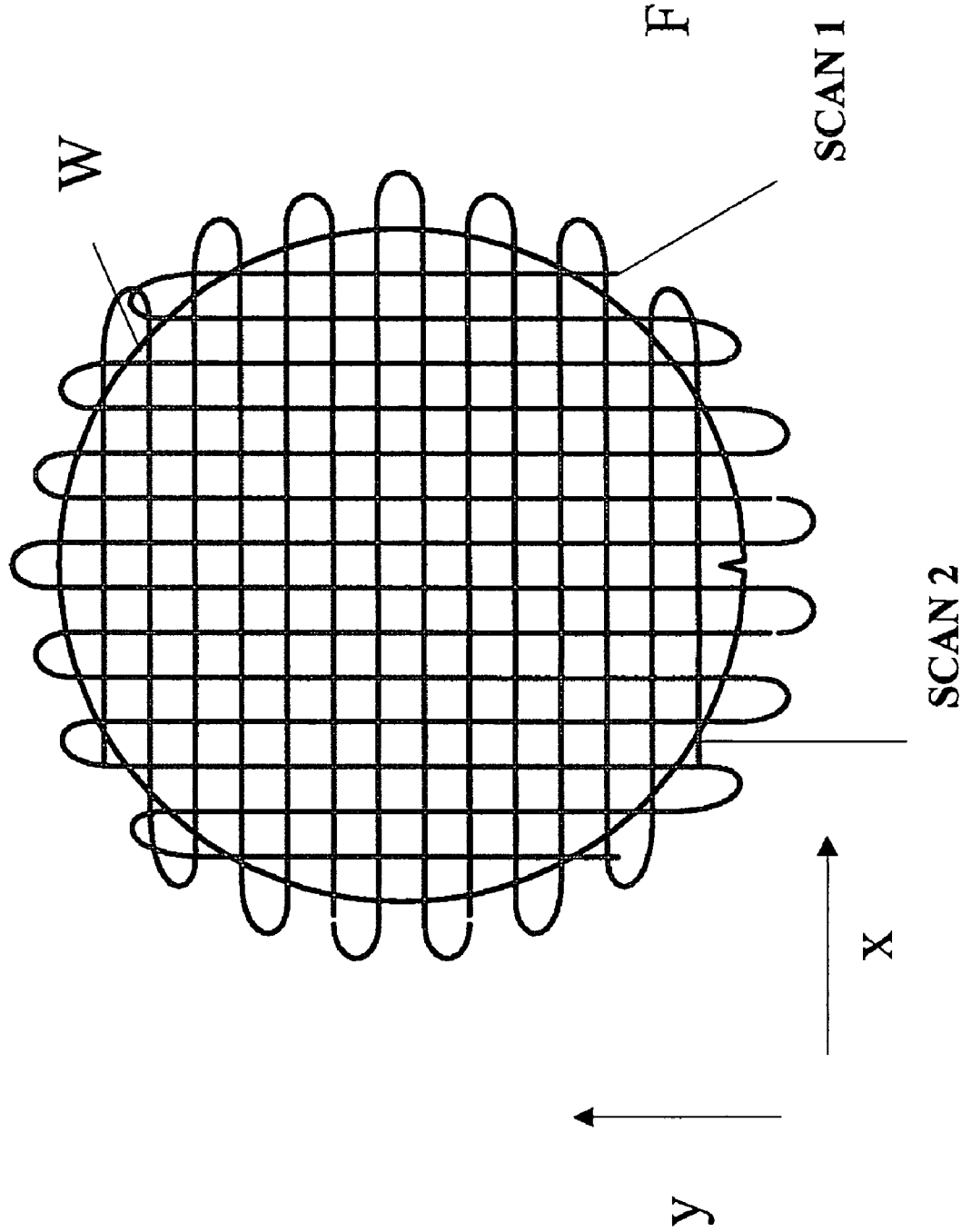
FIG. 3 highly schematically depicts a top view of a substrate and a scanning movement according to an embodiment of the invention.

The reading out of the pattern may in an embodiment be performed by a meandering scanning, an example of which is depicted in FIG. 3. Here, the substrate W is provided with patterns over substantially an entire usable surface thereof (the patterns as such not being depicted in FIG. 3) and a read out of the patterns is performed by performing a meandering, scanning movement resulting in a meandering reading out SCAN 1 to follow lines extending along the Y direction, and a meandering, scanning SCAN 2 to follow lines of the patterns which extend in the X direction. By these meandering movements, a fast scanning of the arrangement of patterns on the surface of the substrate may be obtained. Furthermore, this meandering scanning movement enables to obtain a data structure of measurement read out results (e.g. a read out matrix) which may easily be operable filled and which allows to in a relatively easy way derive position deviations therefrom. It will be appreciated that any other scanning movement may be applied also, including e.g. to first measure all marks of one pattern (spread over 9 cells in the example), then measure all marks of a next pattern and so on and then first measure all marks in one cell, next measure all marks in a next cell and so on . . . .

The pattern as depicted in FIG. 2 will now be described into more detail with reference to FIGS. 4A and B. FIG. 4A shows a single one of the patterns which form the arrangement of patterns as depicted in FIG. 2. It is to be understood that the grid which has been laid over the pattern in FIG. 4a, the grid resulting in squares C3-C5 to E3-E5, is for illustrative purposes only and should be understood as not to form part of the pattern itself. The grid which has been drawn in FIG. 4a (as well as the grid drawn in FIG. 2) is only intended for explanatory purposes. In FIG. 4a, a single one of the patterns is depicted, thus FIG. 4a does not show overlapping, neighbouring patterns. In this example patterns may be considered as to include a centerpart CP and edgeparts which are adjacent to the centerpart CP. The marks which are included in the pattern are distributed in this embodiment over the centerpart and the edgeparts. The marks located in the edgeparts of the pattern are positioned such that, when these marks would be displaced in the direction of the centerpart for a distance equivalent to a distance between following, overlapping patterns (a pitch of the lines of the grid), the displacement being in X direction and/or Y direction, the pattern would form a full pattern in the centerpart CP. Also, marks could be placed in diagonal edgeparts, which may be positioned such that, when these marks would be displaced in the direction of the centerpart for a distance equivalent to a distance between following, overlapping patterns (a pitch of the lines of the grid), the displacement being in X direction and Y direction, the pattern would form a full pattern in the centerpart CP. In this context, a full pattern is to be understood as an arrangement of marks which would be created when the pattern in question in combination with surrounding, overlapping patterns would have been irradiated on the substrate. An example of such a full pattern is shown in FIG. 4b, indicated there as FP. The full pattern FP corresponds to the pattern found in e.g. each of the squares C3-C5 to E3-E5 in FIG. 2. By providing marks in the edge parts, overlap between patterns is enabled, an effect of which having been described above. Further, it maximizes the distances between marks, which is a benefit in case that the Z-sensitivity is obtained by placing small prisms on top of Z-marks, thereby thus making use of the LVT-principle.

As indicated in FIGS. 4a and 4b, the marks include marks to detect displacements in X direction, Y direction and Z direction, i.e. perpendicular to the plane defined by the X and Y axis. The marks extending along the X axis include marks to detect displacements in X direction and Z direction and likewise the marks extending along the Y axis include marks to detect displacements in Y direction and Z direction. The marks to detect displacements in Z direction may include defocus sensitive marks, examples of which are described in the US patent application 2002/0100012 and in US 2002/0015158. In general, defocus sensitive marks are marks which provide for a change in a parameter of a detected beam as a function of a vertical position (i.e. a position in Z dimension) of the mark. The marks which provide information about the position thereof in X direction may include an optical grid which may include fine lines extending substantially perpendicular to the direction of the mark in question. Thus, for the marks which include an X mark, these marks may be provided with a grid of fine lines extending in Y direction, while for the marks extending in Y direction and which are arranged to measure a position of that mark or (thus mark) in Y direction, these may be provided with a plurality of fine lines extending in X direction, examples of which have been indicated in FIG. 4a with grid GX for the X mark and grid GY for the Y mark.

In this embodiment, the marks extending in X direction include marks for detecting a displacement in X direction as well as marks for detecting a displacement in Z direction, while the marks extending in Y direction include marks to detect a displacement in Y direction and marks to detect a displacement in Z direction. In this embodiment, the Z-marks are provided in both the marks extending in X direction as well as Y direction, as, to obtain sufficient information to calibrate zRxRy errors, requires a certain number of Z-marks per cell. Similarly, to obtain sufficient information to calibrate xyRz errors, requires a certain number of X/Y-marks per cell. Using Z marks in both X and Y direction enables the creation of the 'weaving' pattern in FIG. 4b, thus enabling a readout scheme according to FIG. 3. Also, in the embodiment shown here, the distance between the marks is maximized, thus minimizing unwanted interference inside the readout device when reading out.

The incremental position deviations as derived in step 520 may include position deviations in X, Y and Z dimension due to the fact that the pattern may include X, Y and Z marks. Furthermore, from the pattern read out results, also rotational information, i.e. Rx, Ry and Rz may be derived. Thus, a position error may be determined in up to 6 degrees of freedom enabling a calibration of the position of the substrate table in up to 6 degrees of freedom according to the invention.

It will be appreciated that the marks extending in X direction may also include marks to detect a displacement in Y direction and vice versa.

The alignment marks may include alignment marks as are commonly used in present lithographic apparatuses. Alternatively, one may think of box-in-box structures or the like which are commonly used to measure overlay errors of lithographic apparatuses (possibly even for measuring 'registration errors' in printing apparatuses).

In the lithographic apparatus, the calibration method as described here may be controlled by a control system to control the position of the substrate table. The control system (not shown in FIG. 1) may include one or more inputs to receive signals from the sensors which measure the position of the substrate table, and driving outputs to drive actuators to position the substrate table. Furthermore, the control system may be adapted to drive a positioning of the support to support the patterning device and arrange for an irradiating of the pattern onto the substrate.

It is to be understood that the irradiating of the patterns onto the substrate as part of the calibration described here, may be performed making use of a substrate, such as a semi-conductor wafer, which is used for calibration only. Also, it may be the case that the steps of the calibration described here are performed on a substrate on which also other patterns are to be applied, it may e.g. be the case that the patterns which are used for the calibration described here, are arranged in e.g. scribe lines between such other patterns Application thereof may include a (re)calibration of the grid or grid drift detection/monitoring parallel to normal (production) operation of the lithographic apparatus.

The marks described thus far are to be read out using the alignment system of the lithographic apparatus itself. The box-in-box structures as referred to above may be readout out using an 'external' metrology apparatus.

The wording "marks extending along a direction" may be understood as the alignment marks having a shape of a line part, the line part extending in the particular direction, examples of which having been depicted in the enclosed drawing. Also or instead thereof, the wording "marks extending along a direction" may be understood as two ore more marks being positioned substantially in line with each other, thereby a total of the marks extending in the direction.

Having performed the calibration as described here, the lithographic apparatus may process a plurality of substrates, e.g. semi-conductor wafers, making use of the calibration in the two dimensions. From the position deviations as obtained by reading out the patterns in the two dimensions, calibration information may be derived for the respective positions of the patterns in question which are read out. Calibration information as to intermediate positions, i.e. positions of the substrate table which correspond to a position between such patterns, may be obtained by any suitable interpolation. Thus, a calibration of the substrate table position at intermediate positions may be obtained by any suitable interpolation technic, such as a lineair or polynomial interpolation between calibration results at positions which surround the position in question. In an embodiment, neighbouring patterns on the substrate may have a pitch of about 1 mm, thereby providing sufficient calibration points to be able to perform an adequate interpolation for positions of the substrate table which correspond to positions between the respective position at which the calibrations in question have been performed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A calibration method to calibrate a substrate table position in a lithographic apparatus, the method comprising:
   repeatedly irradiating a pattern onto a surface of the substrate so as to create a two dimensional arrangement of patterns on the surface of the substrate, said repeatedly irradiating including displacing the substrate table between successive irradiations to irradiate the pattern onto different locations on the surface of the substrate;
   reading out the patterns to obtain pattern read out results;
   deriving incremental position deviations between two neighboring patterns in each of the two dimensions of the two dimensional arrangement of patterns from the read out results of neighboring patterns, said incremental position deviations in each of the two dimensions being a function of the position of the substrate table in the two dimensions of the two dimensional arrangement;

determining a two dimensional position error of the substrate table as a function of the two dimensional position of the substrate table based on the derived incremental position deviations; and calibrating the position of the substrate table using the position dependent position error, said calibrating includes providing the determined two dimensional position error to a controller that is configured to control the position of the substrate table, wherein the pattern comprises a plurality of marks extending along a first dimension of the two dimensions comprise marks to detect displacements in the first dimension and displacements in a third dimension substantially perpendicular to the first and second dimensions.

2. The calibration method according to claim 1, wherein the two dimensional arrangement comprises a two dimensional matrix according to the two dimensions, the matrix comprising at least two times two patterns.

3. The calibration method according to claim 1, wherein the pattern comprises marks extending along either one of the two dimensions, the incremental position error being derived from a position difference between marks of adjacent patterns, the marks extending in one of the dimensions.

4. The calibration method according to claim 1, wherein neighboring patterns on the substrate at least partly overlap each other.

5. A calibration method to calibrate a substrate table position in a lithographic apparatus, the method comprising:

repeatedly irradiating a pattern onto a surface of the substrate so as to create a two dimensional arrangement of patterns on the surface of the substrate, said repeatedly irradiating including displacing the substrate table between successive irradiations to irradiate the pattern onto different locations on the surface of the substrate;

reading out the patterns to obtain pattern read out results;

deriving incremental position deviations between two neighboring patterns in each of the two dimensions of the two dimensional arrangement of patterns from the read out results of neighboring patterns, said incremental position deviations in each of the two dimensions being a function of the position of the substrate table in the two dimensions of the two dimensional arrangement;

determining a two dimensional position error of the substrate table as a function of the two dimensional position of the substrate table based on the derived incremental position deviations; and calibrating the position of the substrate table using the position dependent position error, said calibrating includes providing the determined two dimensional position error to a controller that is configured to control the position of the substrate table, wherein at least one of the patterns as projected onto the substrate overlaps at least two neighboring patterns in each of the two dimensions, wherein the pattern comprises a plurality of marks, the marks being distributed in the two dimensions over a center part of the pattern and edge parts of the pattern that are adjacent to the center parts, the marks being arranged such that when the marks in the edge parts would be displaced in a direction of the center part over a distance equivalent to a distance between two following, overlapping patterns, the displacement being in at least one of the dimensions, the pattern would form a full pattern in the center part.

6. The calibration method according to claim 1, wherein the marks extending along the second dimension of the two dimensions comprise marks to detect displacements in the second and third dimensions.

7. The calibration method according to claim 1, wherein the marks to detect displacements in a third dimension comprise defocus sensitive marks.

8. The calibration method according to claim 1, wherein the pattern comprises marks to detect displacements in a first, second and third dimensions, the position error comprising a position error in the three dimensions.

9. The calibration method according to claim 1, wherein the reading out of the pattern comprises performing a meandering scanning movement over the surface of substrate to read out the patterns.

10. The calibration method according to claim 9, wherein the meandering is performed by in a meandering way following lines of the arrangement of patterns, which lines extend in a first direction, followed by a following a lines of the arrangement of patterns, which lines extend in a second direction.

11. A lithographic apparatus comprising:
(a) a support constructed to support a patterning device, the patterning device being capable of imparting a radiation beam with a pattern in its cross-section to form a patterned radiation beam;
(b) a substrate table constructed to hold a substrate;
(c) a projection system configured to project the patterned radiation beam onto a target portion of the substrate, and
(d) a control system to control a position of the substrate table, the control system being arranged to calibrate the position of the substrate table by:
  (i) repeatedly irradiating a pattern onto a surface of the substrate so as to create a two dimensional arrangement of patterns on the surface of the substrate, the irradiating including displacing the substrate table between successive irradiations to irradiate the pattern onto different locations on the surface of the substrate;
  (ii) reading out the patterns to obtain pattern read out results;
  (iii) deriving incremental position deviations between two neighboring patterns in each of the two dimensions of the two dimensional arrangement of patterns from the read out results of neighboring patterns, said incremental position deviations in each of the two dimensions being a function of the position of the substrate table in the two dimensions of the two dimensional arrangement;
  (iv) determining a two dimensional position error of the substrate table as a function of the two dimensional position of the substrate table based on the derived incremental position deviations; and
  (v) calibrating the position of the substrate table using the position dependent position error, said calibrating includes providing the determined two dimensional position error to a controller that is configured to control the position of the substrate table, wherein the pattern comprises a plurality of marks extending along a first dimension of the two dimensions comprise marks to detect displacements in the first dimension and displacements in a third dimension substantially perpendicular to the first and second dimensions.

12. The lithographic apparatus according to claim 11, wherein the two dimensional arrangement comprises a two dimensional matrix according to the two dimensions, the matrix comprising at least two times two patterns.

13. The lithographic apparatus according to claim 11, wherein the control system is arranged to irradiate neighboring patterns on the substrate such that they at least partly overlap each other.

14. The lithographic apparatus according to claim 11, wherein the pattern comprises marks extending along either one of the two dimensions, the incremental position error being derived from a position difference between marks of adjacent patterns, the marks extending in one of the dimensions.

15. A lithographic apparatus comprising:
 (a) a support constructed to support a patterning device, the patterning device being capable of imparting a radiation beam with a pattern in its cross-section to form a patterned radiation beam;
 (b) a substrate table constructed to hold a substrate;
 (c) a projection system configured to project the patterned radiation beam onto a target portion of the substrate, and
 (d) a control system to control a position of the substrate table, the control system being arranged to calibrate the position of the substrate table by:
  (i) repeatedly irradiating a pattern onto a surface of the substrate so as to create a two dimensional arrangement of patterns on the surface of the substrate, the irradiating including displacing the substrate table between successive irradiations to irradiate the pattern onto different locations on the surface of the substrate;
  (ii) reading out the patterns to obtain pattern read out results;
  (iii) deriving incremental position deviations between two neighboring patterns in each of the two dimensions of the two dimensional arrangement of patterns from the read out results of neighboring patterns, said incremental position deviations in each of the two dimensions being a function of the position of the substrate table in the two dimensions of the two dimensional arrangement;
  (iv) determining a two dimensional position error of the substrate table as a function of the two dimensional position of the substrate table based on the derived incremental position deviations; and
  (v) calibrating the position of the substrate table using the position dependent position error, said calibrating includes providing the determined two dimensional position error to a controller that is configured to control the position of the substrate table,
 wherein the control system is arranged to project the pattern onto the substrate such that at least one of the patterns as projected onto the substrate overlaps at least two neighboring patterns in each of the two dimensions,
 wherein the pattern comprises a plurality of marks, the marks being distributed in the two dimensions over a center part of the pattern and edge parts of the patterns that are adjacent to the center parts, the marks being arranged such that when the marks in the edge parts would be displaced in a direction of the center part over a distance equivalent to a distance between two following, overlapping patterns, the displacement being in at least one of the dimensions, the pattern would form a full pattern in the center part.

16. The lithographic apparatus according to claim 11, wherein the marks extending along the second dimension of the two dimensions comprise marks to detect displacements in the second and third dimensions.

17. The lithographic apparatus according to claim 11, wherein the marks to detect displacements in a third dimension comprise defocus sensitive marks.

18. The lithographic apparatus according to claim 11, wherein the pattern comprises marks to detect displacements in a first, second and third dimensions, the position error comprising a position error in the three dimensions.

19. The lithographic apparatus according to claim 11, wherein the control system being arranged such that the reading out of the pattern comprises performing a meandering scanning movement over the surface of substrate to read out the patterns.

20. The lithographic apparatus according to claim 19, wherein the meandering is performed by in a meandering way following lines of the arrangement of patterns, which lines extend in a first direction, followed by a following a lines of the arrangement of patterns, which lines extend in a second direction.

* * * * *